(12) United States Patent
Pagaila et al.

(10) Patent No.: US 9,620,455 B2
(45) Date of Patent: Apr. 11, 2017

(54) SEMICONDUCTOR DEVICE AND METHOD OF FORMING ANISOTROPIC CONDUCTIVE FILM BETWEEN SEMICONDUCTOR DIE AND BUILD-UP INTERCONNECT STRUCTURE

(75) Inventors: Reza A. Pagaila, Singapore (SG); Yaojian Lin, Singapore (SG); Jun Mo Koo, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 752 days.

(21) Appl. No.: 12/822,458

(22) Filed: Jun. 24, 2010

(65) Prior Publication Data

US 2011/0316146 A1    Dec. 29, 2011

(51) Int. Cl.
*H01L 21/00*    (2006.01)
*H01L 23/538*    (2006.01)
(Continued)

(52) U.S. Cl.
CPC .......... *H01L 23/5389* (2013.01); *H01L 21/56* (2013.01); *H01L 21/561* (2013.01); *H01L 21/563* (2013.01); *H01L 21/568* (2013.01); *H01L 21/6835* (2013.01); *H01L 23/13* (2013.01); *H01L 23/49816* (2013.01); *H01L 24/19* (2013.01); *H01L 24/20* (2013.01); *H01L 24/96* (2013.01); *H01L 24/97* (2013.01); *H01L 25/0657* (2013.01); *H01L 25/50* (2013.01); *H01L 23/3107* (2013.01);
(Continued)

(58) Field of Classification Search
CPC ......... H01L 24/19; H01L 24/20; H01L 24/97;
H01L 24/11; H01L 24/13; H01L 24/16;
H01L 24/29; H01L 24/32; H01L 21/563;
H01L 21/568; H01L 21/6835; H01L 21/6836
USPC .................. 438/106–108, 110–113, 119, 55, 438/123–127; 257/782, 787, E21.599, 257/E21.499, 783, 785, 798, E23.001, 257/E23.002, E23.01, E23.141, E23.116, 257/E23.117, E23.123, E23.129, E23.134
See application file for complete search history.

(56) References Cited

U.S. PATENT DOCUMENTS 5,250,843 A    10/1993   Eichelberger
5,353,498 A    10/1994   Fillion et al.
(Continued)

*Primary Examiner* — Victoria K Hall
(74) *Attorney, Agent, or Firm* — Robert D. Atkins; Patent Law Group: Atkins and Associates, P.C.

(57) ABSTRACT

A semiconductor wafer contains a plurality of semiconductor die with bumps formed over contact pads on an active surface of the semiconductor die. An ACF is deposited over the bumps and active surface of the wafer. An insulating layer can be formed between the ACF and semiconductor die. The semiconductor wafer is singulated to separate the die. The semiconductor die is mounted to a temporary carrier with the ACF oriented to the carrier. The semiconductor die is forced against the carrier to compress the ACF under the bumps and form a low resistance electrical interconnect to the bumps. An encapsulant is deposited over the semiconductor die and carrier. The carrier is removed. An interconnect structure is formed over the semiconductor die and encapsulant. The interconnect structure is electrically connected through the compressed ACF to the bumps. The ACF reduces shifting of the semiconductor die during encapsulation.

24 Claims, 16 Drawing Sheets

(51) Int. Cl.
| | |
|---|---|
| *H01L 21/56* | (2006.01) |
| *H01L 21/683* | (2006.01) |
| *H01L 23/13* | (2006.01) |
| *H01L 23/498* | (2006.01) |
| *H01L 25/065* | (2006.01) |
| *H01L 25/00* | (2006.01) |
| *H01L 23/31* | (2006.01) |
| *H01L 23/00* | (2006.01) |

(52) U.S. Cl.
CPC .......... *H01L 23/3128* (2013.01); *H01L 24/05* (2013.01); *H01L 24/11* (2013.01); *H01L 24/13* (2013.01); *H01L 24/16* (2013.01); *H01L 24/29* (2013.01); *H01L 24/32* (2013.01); *H01L 24/48* (2013.01); *H01L 24/95* (2013.01); *H01L 2221/68327* (2013.01); *H01L 2221/68381* (2013.01); *H01L 2221/68386* (2013.01); *H01L 2224/0401* (2013.01); *H01L 2224/04042* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/12105* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16146* (2013.01); *H01L 2224/16225* (2013.01); *H01L 2224/16227* (2013.01); *H01L 2224/16265* (2013.01); *H01L 2224/21* (2013.01); *H01L 2224/2105* (2013.01); *H01L 2224/215* (2013.01); *H01L 2224/22* (2013.01); *H01L 2224/221* (2013.01); *H01L 2224/2919* (2013.01); *H01L 2224/29144* (2013.01); *H01L 2224/32145* (2013.01); *H01L 2224/32245* (2013.01); *H01L 2224/48091* (2013.01); *H01L 2224/48105* (2013.01); *H01L 2224/48175* (2013.01); *H01L 2224/48227* (2013.01); *H01L 2224/48228* (2013.01); *H01L 2224/73204* (2013.01); *H01L 2224/73209* (2013.01); *H01L 2224/73259* (2013.01); *H01L 2224/73265* (2013.01); *H01L 2224/97* (2013.01); *H01L 2225/06513* (2013.01); *H01L 2225/06517* (2013.01); *H01L 2225/06541* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01079* (2013.01); *H01L 2924/01082* (2013.01); *H01L 2924/01322* (2013.01); *H01L 2924/07811* (2013.01); *H01L 2924/09701* (2013.01); *H01L 2924/1203* (2013.01); *H01L 2924/12041* (2013.01); *H01L 2924/1304* (2013.01); *H01L 2924/1306* (2013.01); *H01L 2924/13091* (2013.01); *H01L 2924/14* (2013.01); *H01L 2924/1433* (2013.01); *H01L 2924/1434* (2013.01); *H01L 2924/14335* (2013.01); *H01L 2924/15172* (2013.01); *H01L 2924/15311* (2013.01); *H01L 2924/181* (2013.01); *H01L 2924/18162* (2013.01); *H01L 2924/19041* (2013.01); *H01L 2924/19042* (2013.01); *H01L 2924/19043* (2013.01); *H01L 2924/19104* (2013.01)

(56) References Cited

U.S. PATENT DOCUMENTS

| | | | |
|---|---|---|---|
| 5,841,193 A | 11/1998 | Eichelberger | |
| 6,007,920 A * | 12/1999 | Umehara | H01L 21/304 257/E21.237 |
| 6,110,806 A * | 8/2000 | Pogge | 438/458 |
| 6,190,509 B1 * | 2/2001 | Haba | 204/164 |
| 6,518,097 B1 | 2/2003 | Yim et al. | |
| 6,730,542 B2 * | 5/2004 | Wang | H01L 21/563 257/778 |
| 6,919,262 B2 * | 7/2005 | Senoo | H01L 21/6836 156/289 |
| 7,619,901 B2 | 11/2009 | Eichelberger et al. | |
| 2001/0016372 A1 * | 8/2001 | Murakami | H01L 21/563 438/113 |
| 2001/0040298 A1 * | 11/2001 | Baba | H01L 21/56 257/778 |
| 2002/0142518 A1 | 10/2002 | Ding et al. | |
| 2004/0032013 A1 * | 2/2004 | Cobbley et al. | 257/678 |
| 2005/0173813 A1 * | 8/2005 | Oshima | 257/787 |
| 2006/0035036 A1 * | 2/2006 | Yim | C09J 9/02 428/1.1 |
| 2006/0170096 A1 | 8/2006 | Yang et al. | |
| 2007/0114661 A1 * | 5/2007 | Choi et al. | 257/737 |
| 2009/0020865 A1 * | 1/2009 | Su | 257/698 |
| 2009/0029504 A1 * | 1/2009 | Paik et al. | 438/108 |
| 2009/0039491 A1 * | 2/2009 | Kim et al. | 257/686 |
| 2009/0051029 A1 * | 2/2009 | Kurita et al. | 257/737 |
| 2010/0041183 A1 * | 2/2010 | Yamano | 438/124 |
| 2010/0112759 A1 * | 5/2010 | Kobayashi | H01L 23/49827 438/121 |
| 2011/0031634 A1 * | 2/2011 | Pagaila | 257/777 |

* cited by examiner

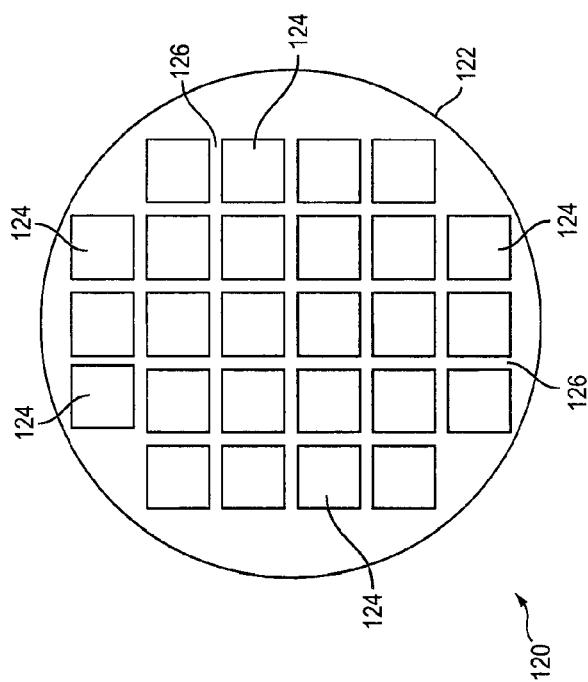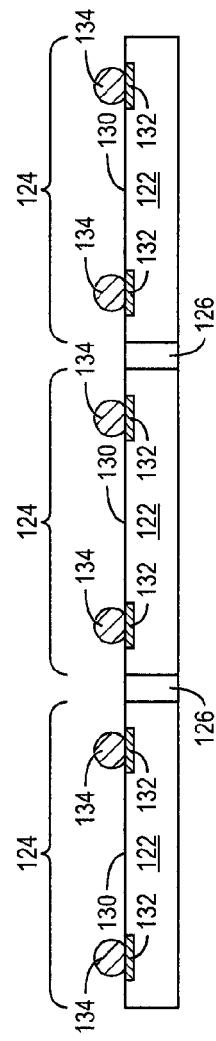
FIG. 3a
FIG. 3b

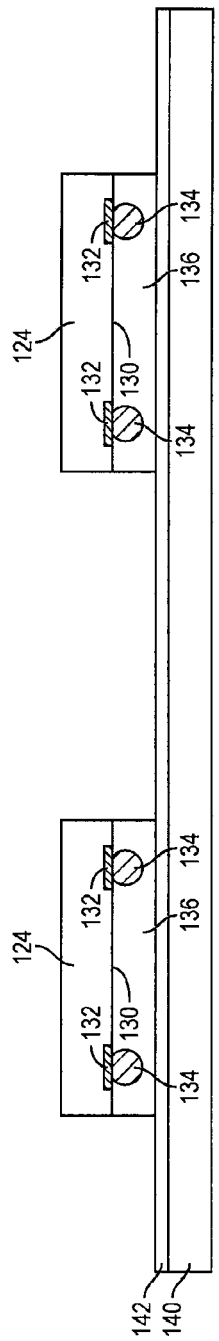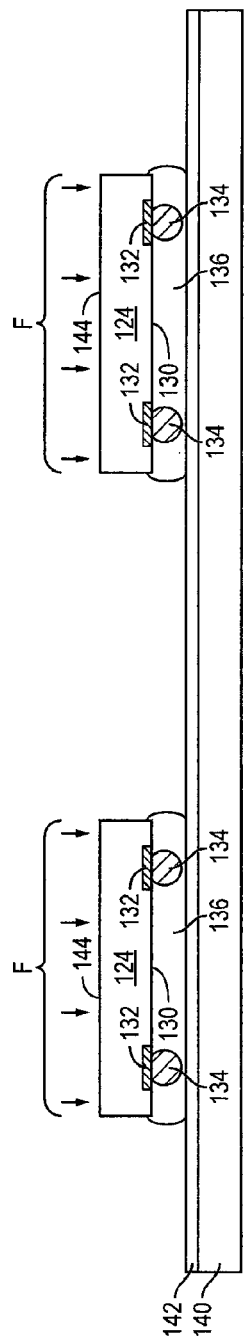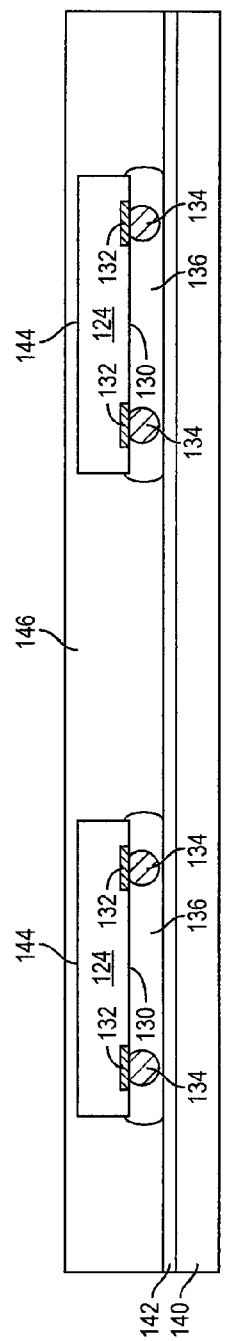

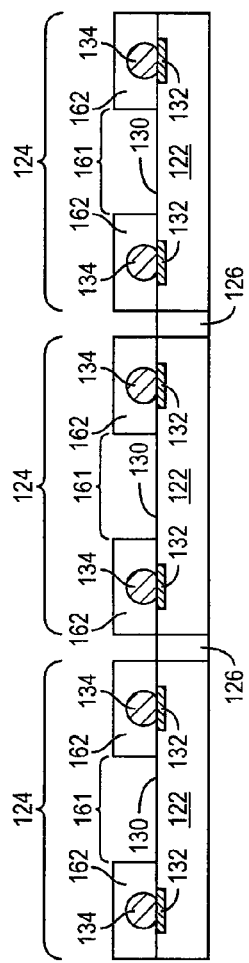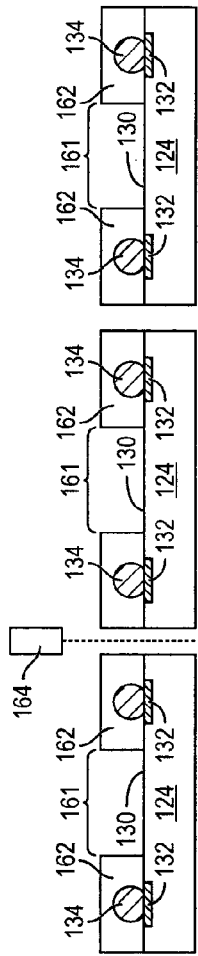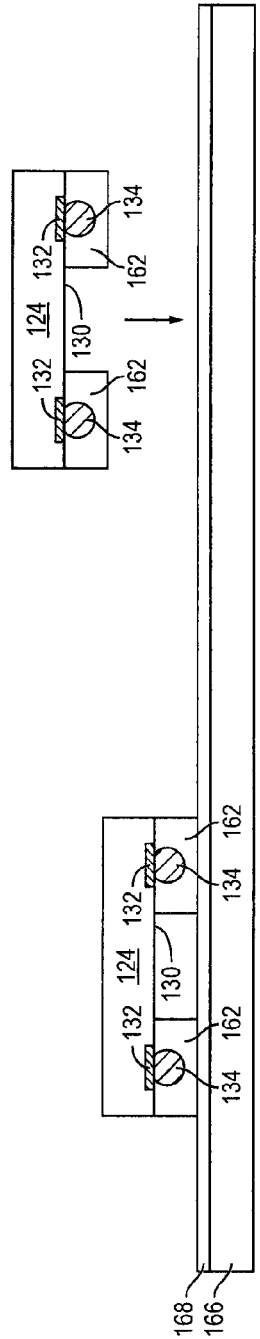

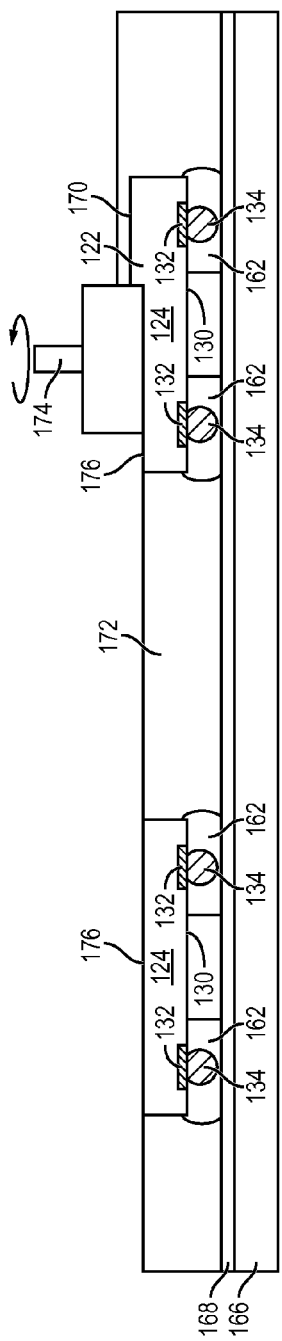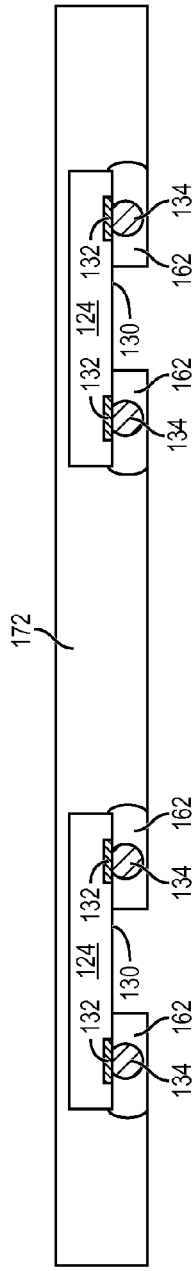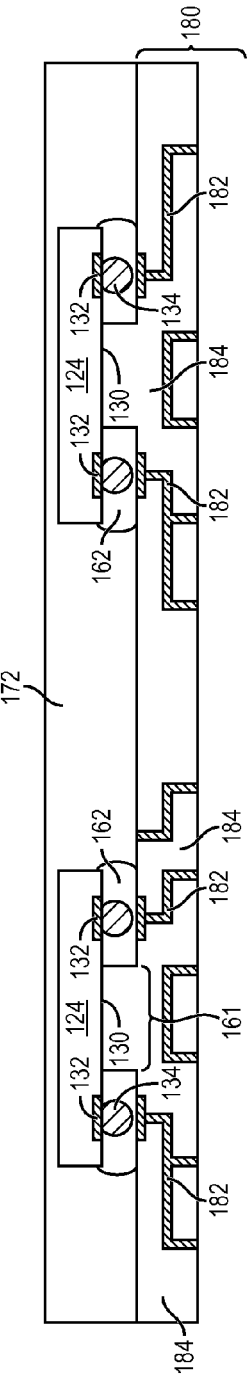

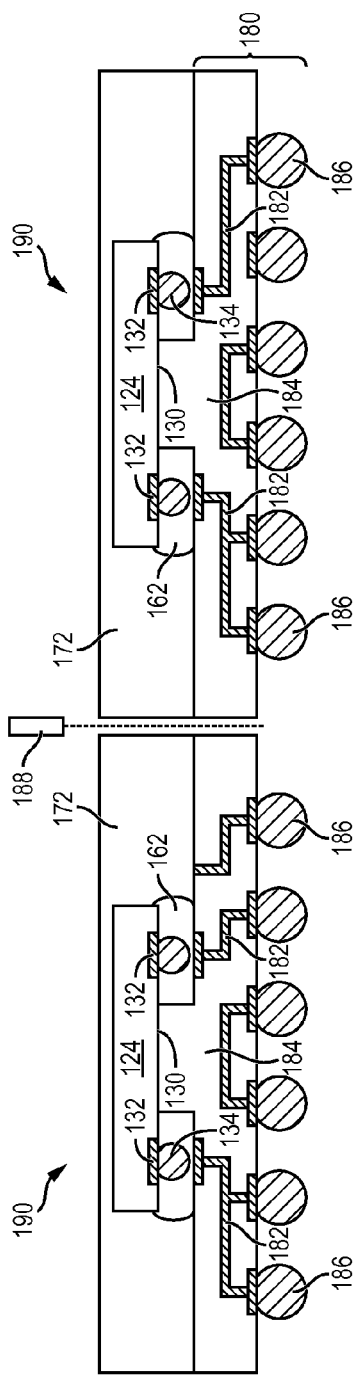
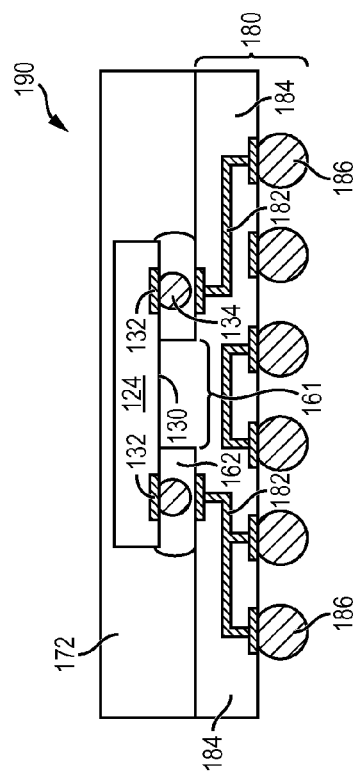
FIG. 7h
FIG. 8

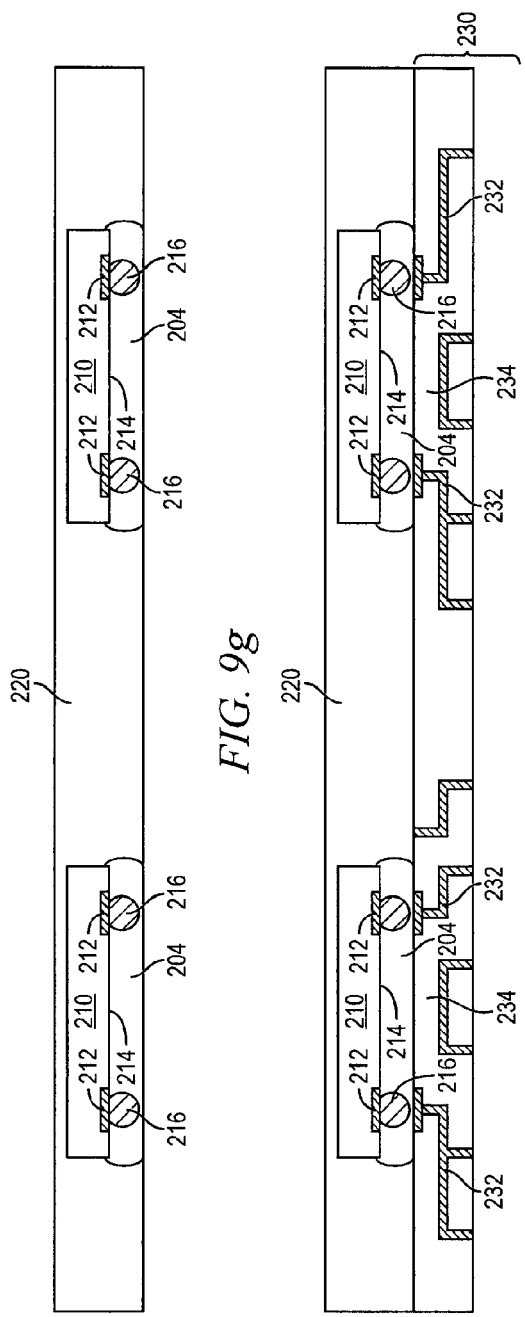
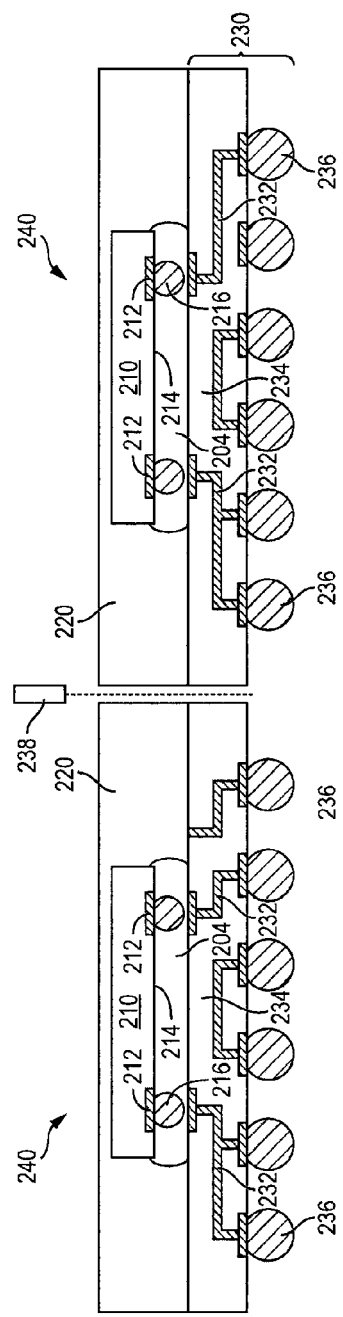

SEMICONDUCTOR DEVICE AND METHOD OF FORMING ANISOTROPIC CONDUCTIVE FILM BETWEEN SEMICONDUCTOR DIE AND BUILD-UP INTERCONNECT STRUCTURE

FIELD OF THE INVENTION

The present invention relates in general to semiconductor devices and, more particularly, to a semiconductor device and method of forming an anisotropic conductive film between a semiconductor die and build-up interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP), a semiconductor die is commonly mounted to a temporary carrier. An encapsulant is deposited over the semiconductor die and carrier. The carrier is removed to expose the semiconductor die, and a build-up interconnect structure is formed over the exposed semiconductor die.

The semiconductor die is known to vertically and laterally shift during encapsulation which can cause misalignment of the build-up interconnect structure. One technique of securing the semiconductor die to the carrier to reduce die shifting involves forming wettable pads over the carrier and securing the semiconductor die to the wettable pads with bumps. The formation of wettable pads typically involves photolithography, etching, and plating, which are time consuming and costly manufacturing processes. The wettable pads and bumps increase interconnect resistance between the semiconductor die and build-up interconnect structure. Moreover, the gap between semiconductor die and carrier must be sufficiently high to achieve a uniform underfill around the bumps without forming voids. The gap has the undesired result of increasing package thickness. The gap also increases the bump size which increases bump pitch and reduces input/output (I/O) count.

SUMMARY OF THE INVENTION

A need exists to reduce die shifting during encapsulation while providing a low resistance electrical interconnect between the semiconductor die and build-up interconnect structure. Accordingly, in one embodiment, the present invention is a method of making a semiconductor device comprising the steps of providing a semiconductor wafer having a plurality of semiconductor die with bumps formed over contact pads on an active surface of the semiconductor die, depositing an ACF over the bumps and active surface of the semiconductor wafer, singulating the semiconductor wafer to separate the semiconductor die, providing a temporary carrier, mounting the semiconductor die with the ACF oriented to the temporary carrier, compressing the ACF under the bumps to form an electrical interconnect to the bumps, depositing an encapsulant over the semiconductor die and temporary carrier, removing the temporary carrier to expose the semiconductor die, and forming an interconnect structure over the exposed semiconductor die and encapsulant. The interconnect structure is electrically connected through the compressed ACF to the bumps.

In another embodiment, the present invention is a method of making a semiconductor device comprising the steps of providing a semiconductor die with bumps formed over contact pads on an active surface of the semiconductor die, depositing an ACF over the bumps, providing a carrier, mounting the semiconductor die with the ACF oriented to the carrier, compressing the ACF under the bumps, depositing an encapsulant over the semiconductor die and carrier, removing the carrier to expose the semiconductor die, and forming an interconnect structure over the exposed semiconductor die and encapsulant. The interconnect structure is electrically connected through the compressed ACF to the bumps.

In another embodiment, the present invention is a method of making a semiconductor device comprising the steps of providing a semiconductor die with contact pads, providing a carrier, mounting the semiconductor die to the carrier with an ACF between the semiconductor die and carrier, compressing the ACF under the contact pads, depositing an encapsulant over the semiconductor die and carrier, removing the carrier to expose the semiconductor die, and forming an interconnect structure over the exposed semiconductor die and encapsulant. The interconnect structure is electrically connected through the compressed ACF to the contact pads of the semiconductor die.

In another embodiment, the present invention is a semiconductor device comprising a semiconductor die with contact pads. An ACF is formed over the semiconductor die. A portion of the ACF is compressed to form an electrical connection to the contact pads. An encapsulant is deposited over the semiconductor die. An interconnect structure is formed over the semiconductor die and encapsulant. The interconnect structure is electrically connected through the compressed ACF to the contact pads.

BRIEF DESCRIPTION OF THE DRAWINGS

FIGS. 3a-3d illustrate a process of forming ACF over bumps and active surface of a semiconductor wafer;

FIGS. 4a-4h illustrate a process of forming a FO-WLCSP with ACF over the bumps and active surface of the semiconductor die;

FIGS. 6a-6b illustrate a process of forming ACF over bumps of a semiconductor wafer;

FIGS. 7a-7h illustrate a process of forming a FO-WLCSP with ACF over the bumps of the semiconductor die;

FIG. 8 illustrates the FO-WLCSP with ACF over the bumps of the semiconductor die;

FIGS. 9a-9i illustrate another process of forming a FO-WLCSP with ACF over the bumps and active surface of the semiconductor die;

DETAILED DESCRIPTION OF THE DRAWINGS

Figure 1:
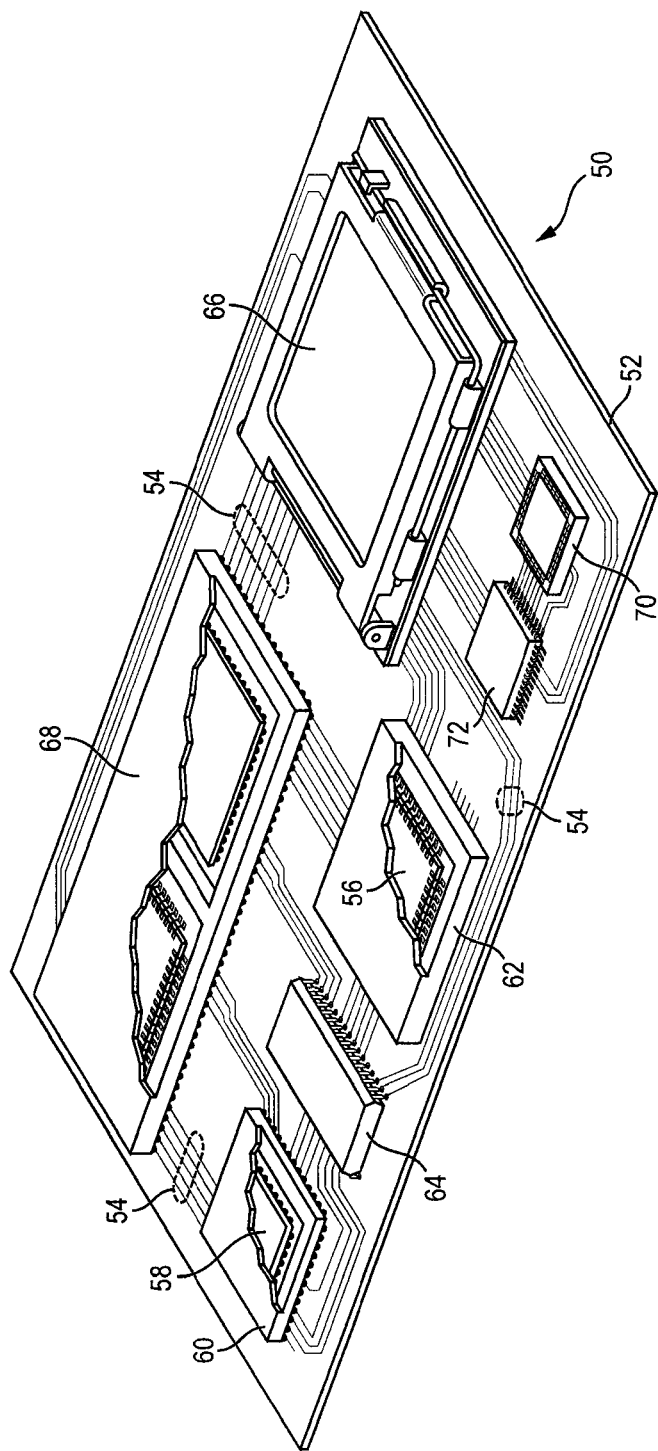
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
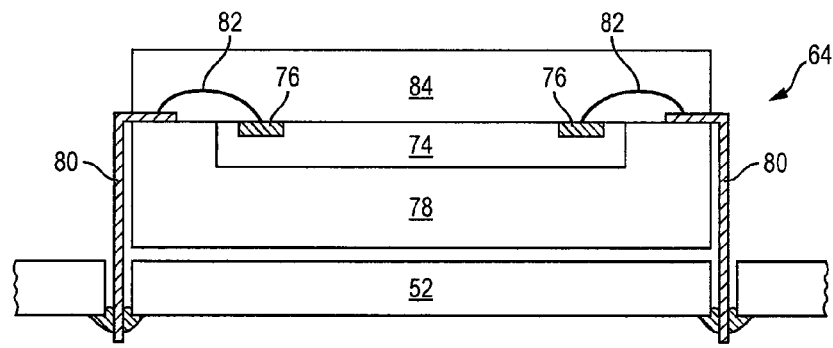
FIGS. 2a-2c illustrate further detail of the representative semiconductor packages mounted to the PCB.
Figure 2B:
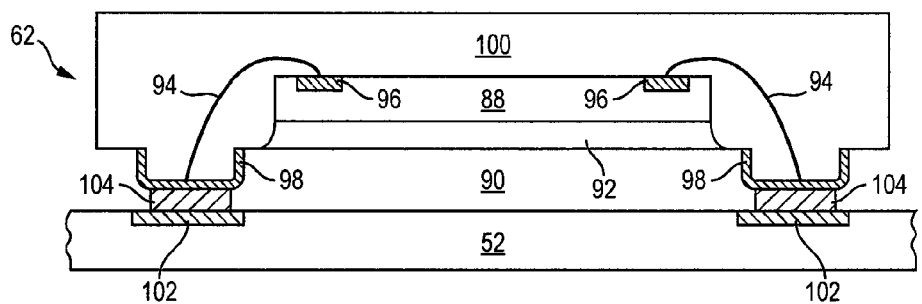
Figure 2C:
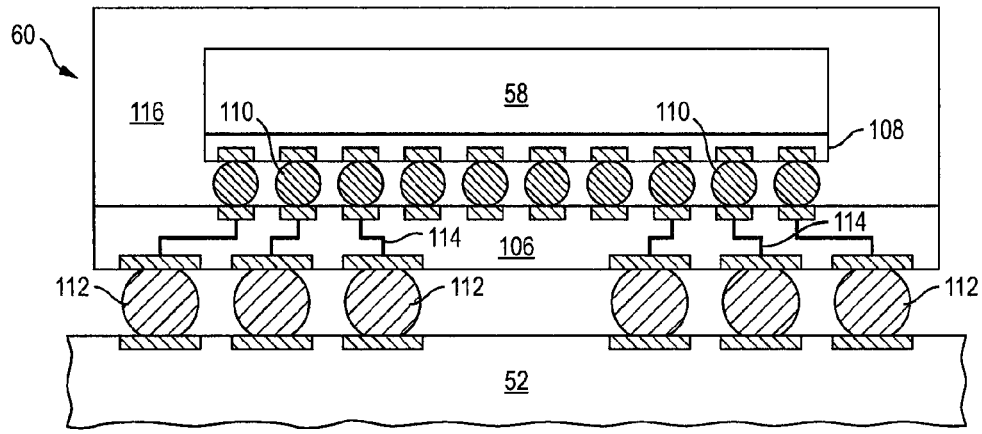

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

An electrically conductive bump material is deposited over contact pads 132 while in wafer form using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form spherical or rounded balls or bumps 134. In some applications, bumps 134 are reflowed a second time to improve electrical contact to contact pads 132. The bumps can also be compression bonded to contact pads 132.

Figure 3C:
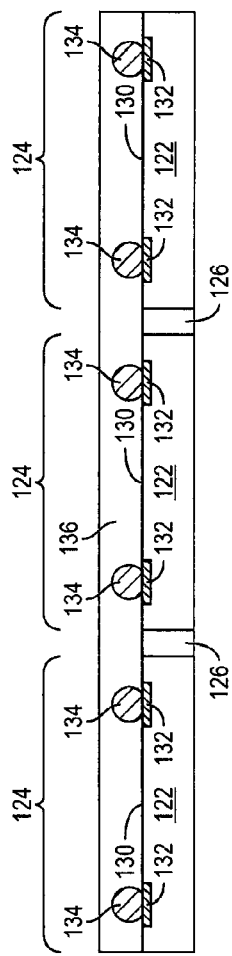

In FIG. 3c, an anisotropic conductive film (ACF) 136 is deposited over bumps 134 and active surface 130 of semiconductor wafer 120 using lamination, printing, or other suitable application process. Alternatively, anisotropic conductive paste (ACP) or anisotropic conductive adhesive (ACA) can be deposited over bumps 134 and active surface 130. ACF 136 can be epoxy or acryl-based material with B-stage properties for reliable wafer dicing. In one embodiment, ACF 136 contains metal particles or matrix of conductive particles, each having a polymer core with Ni plating and Au plating and outer polymer coating. ACF 136 has a thickness greater than a height of bumps 134. In its normal state, ACF 136 is non-conductive as the conductive particles are not in electrical contact with adjacent conductive particles. However, under proper conditions of force and temperature, certain portions of ACF 136 can be made conductive as the particles are forced together to form an electrical connection.

Figure 3D:
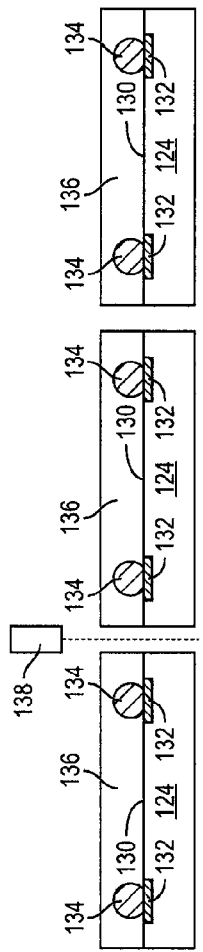

In FIG. 3d, semiconductor wafer 120 is singulated through saw street 126 using saw blade or laser cutting tool 138 into individual semiconductor die 124. Each semiconductor die 124 has ACF 136 over bumps 134 and active surface 130.

Figure 4A:
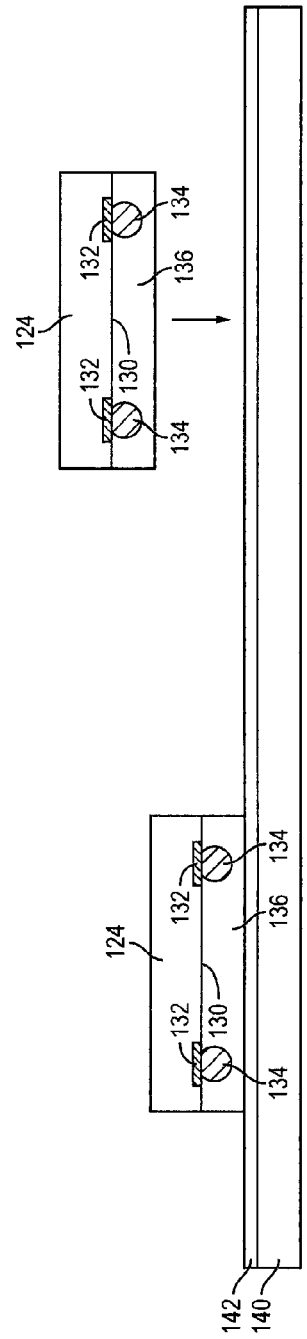

FIGS. 4a-4h illustrate, in relation to FIGS. 1 and 2a-2c, a process of forming a FO-WLCSP with ACF over the bumps and active surface of a semiconductor die. In FIG. 4a, a temporary carrier or substrate 140 contains sacrificial base material such as silicon, polymer, polymer composite, metal, ceramic, glass, glass epoxy, beryllium oxide, or other suitable low-cost, rigid material or bulk semiconductor material for structural support. An optional interface layer or double-sided tape 142 can be formed over carrier 140 as a temporary adhesive bonding film or etch-stop layer.

Semiconductor die 124, with ACF 136 formed over active surface 130 and bumps 134, are mounted to carrier 140. FIG. 4b shows all semiconductor die 124 mounted to carrier 140 to form a reconstituted wafer with bumps 134 embedded within ACF 136.

In FIG. 4c, a force F is applied to back surface 144 of semiconductor die 124, opposite active surface 130, under high temperature, e.g., 100-300° C. for 10 seconds to 60 minutes, to press the semiconductor die 124 against carrier 140 and compress a portion of ACF 136 under bumps 134. The force F compresses the matrix of conductive particles under bumps 134 to form a low resistance electrical connection to the bumps. An optional electric field can be applied in line with the contact pads or bumps to reposition the conductive particles inside ACF 136 to be aligned with or concentrated under the bumps or contact pads. The electric field aids in making physical connection between the conductive particles in the compressed ACF 136 in order to form an electrical path to bumps 134. The portion of ACF 136 which is not under bumps 134, e.g., the portion of ACF 136 under active surface 130, remains in its normal state, i.e., non-compressed and non-conductive. As ACF 136 is compressed under force F, a portion of the ACF extends outwardly and over the edge of semiconductor die 124 which enhances adhesion between the semiconductor die and carrier. The force F is removed after the portion of ACF 136 under bumps 134 is compressed. Bumps 134 remain substantially enclosed by ACF 136 after the force F is removed. The portion of ACF 136 under bumps 134 provides a low resistance electrical connection between the bumps and subsequent build-up interconnect structure. Bumps 134 can be relatively small, e.g., micro-bumps, to realize ultra thin packages without void formation. The small bumps 134 provide a fine interconnect pitch and, in some cases, can be omitted by compressing ACF 136 under contact pads 132. ACF 136 is cured by the elevated temperature to firmly hold semiconductor die 124 to carrier 140.

In FIG. 4d, an encapsulant or molding compound 146 is deposited over semiconductor die 124 and carrier 140 using a paste printing, compressive molding, transfer molding, liquid encapsulant molding, vacuum lamination, spin coating, or other suitable applicator. ACF 136 holds semiconductor die 124 to carrier 140 to reduce die shifting during encapsulation. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants.

Figure 4E:
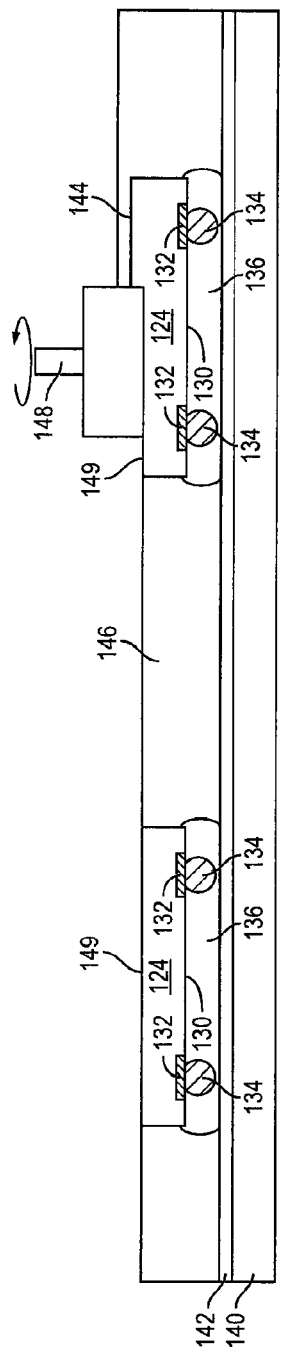

FIG. 4e shows an optional backgrinding operation where grinder 148 removes a portion of encapsulant 146 and bulk material 122 from back surface 144 of semiconductor die 124. Semiconductor die 124 is thinner and new back surface 149 is co-planar with encapsulant 146 following the grinding process.

Figure 4F:
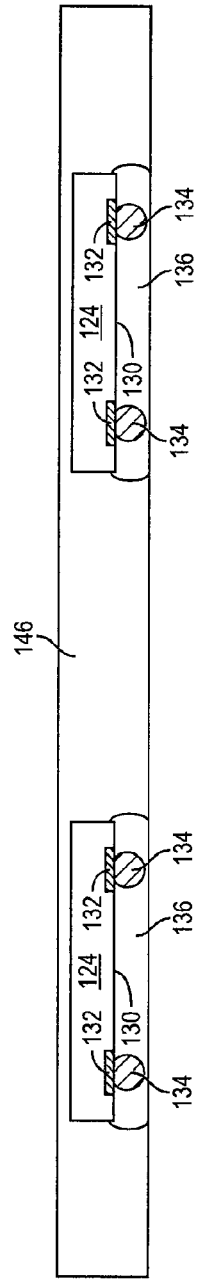

Continuing from FIG. 4d, temporary carrier 140 and interface layer 142 are removed by chemical etching, mechanical peel-off, CMP, mechanical grinding, thermal bake, UV light, laser scanning, or wet stripping, as shown in FIG. 4f.

Figure 4G:
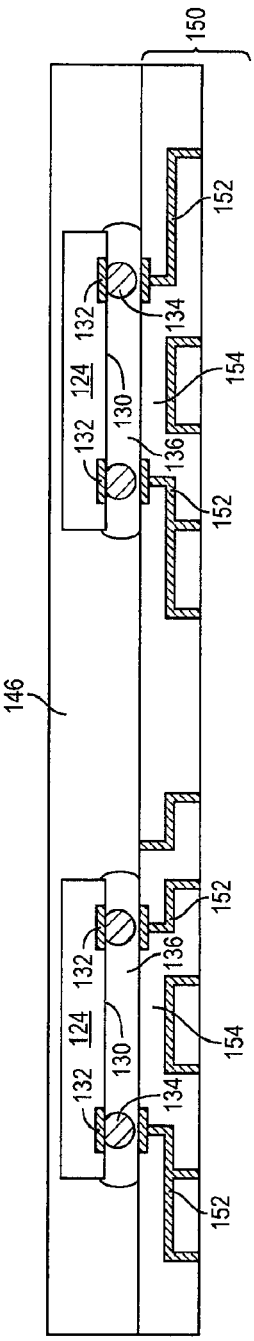

In FIG. 4g, a bottom-side build-up interconnect structure 150 is formed over ACF 136, bumps 134, and encapsulant 146. The build-up interconnect structure 150 includes an electrically conductive layer or redistribution layer (RDL) 152 formed using a patterning and metal deposition process such as sputtering, electrolytic plating, and electroless plating. Conductive layer 152 can be one or more layers of Al, Cu, Sn, Ni, Au, Ag, or other suitable electrically conductive material. One portion of conductive layer 152 is electrically connected through the compressed portion of ACF 136 to bumps 134. Other portions of conductive layer 152 can be electrically common or electrically isolated depending on the design and function of semiconductor die 124.

The build-up interconnect structure 150 further includes an insulating or passivation layer 154 formed between conductive layers 152 for electrical isolation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 154 is formed using PVD, CVD, printing, spin coating, spray coating, sintering or thermal oxidation.

Figure 4H:
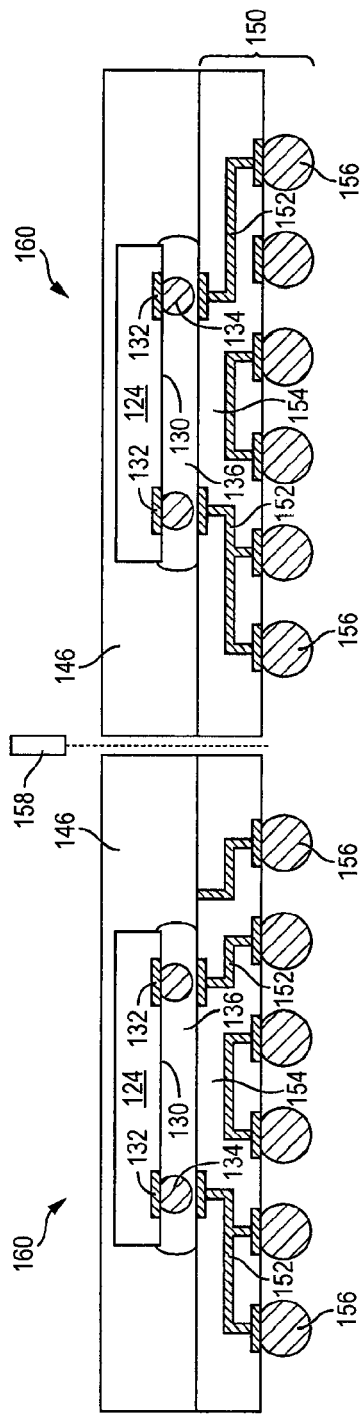

In FIG. 4h, an electrically conductive bump material is deposited over build-up interconnect structure 150 and electrically connected to conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. The bumps can also be compression bonded to conductive layer 152. Bumps 156 represent one type of interconnect structure that can be formed over conductive layer 152. The interconnect structure can also use bond wires, stud bump, micro bump, or other electrical interconnect.

Figure 5:
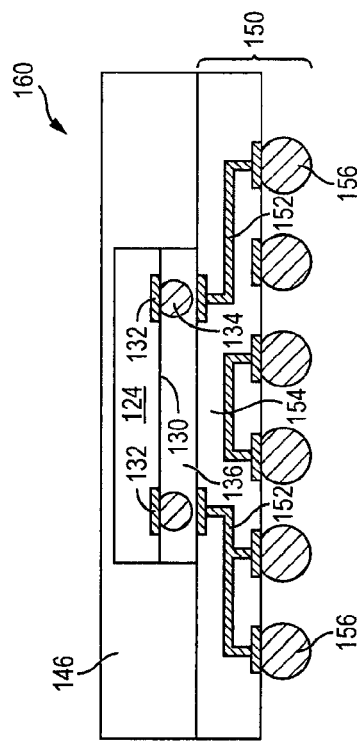
FIG. 5 illustrates the FO-WLCSP with ACF over the bumps and active surface of the semiconductor die.

Semiconductor die 124 are singulated with saw blade or laser cutting tool 158 into individual FO-WLCSP 160. FIG. 5 shows FO-WLCSP 160 after singulation. Semiconductor die 124 is electrically connected through bumps 134 and the compressed portion of ACF 136 to build-up interconnect structure 150 and bumps 156. Compressing ACF 136 under bumps 134 forms a low resistance interconnect between contact pads 132 and conductive layer 152. ACF 136 eliminates the need to form wettable pads. ACF 136 bonds semiconductor die 124 to carrier 140 and reduces die shifting during encapsulation. Bumps 134 can be relatively small, e.g., micro-bumps, to realize ultra thin packages with a fine interconnect pitch and high I/O count. In addition, ACF 136 acts as a buffer layer to reduce stress induced by a coefficient of thermal expansion (CTE) mismatch between semiconductor die 124 and build-up interconnect structure 150.

In another embodiment, continuing from FIG. 3b, semiconductor die 124 has a sensitive RF region 161 between bumps 134. ACF 162 is selectively deposited over areas of semiconductor die 124 which are not sensitive to conductive materials using needle dispensing or other suitable application process, as shown in FIG. 6a. In this case, ACF 162 is selectively deposited over and around bumps 134 and omitted from the sensitive RF region of active surface 130. Alternatively, ACP or ACA can be deposited over bumps 134. ACF 162 can be epoxy or acryl-based material with B-stage properties for reliable wafer dicing. In one embodiment, ACF 162 contains a matrix of conductive particles, each having a polymer core with Ni plating and Au plating and outer polymer coating. ACF 162 has a thickness greater than a height of bumps 134. In its normal state, ACF 162 is non-conductive as the conductive particles are not in electrical contact with adjacent conductive particles. However, under proper conditions of force and temperature, certain portions of ACF 162 can be made conductive as the particles are forced together to form an electrical connection.

In FIG. 6b, semiconductor wafer 120 is singulated through saw street 126 using saw blade or laser cutting tool 164 into individual semiconductor die 124. Each semiconductor die 124 has ACF 162 over bumps 134 with the sensitive RF region of active surface 130 exposed.

Figure 7B:
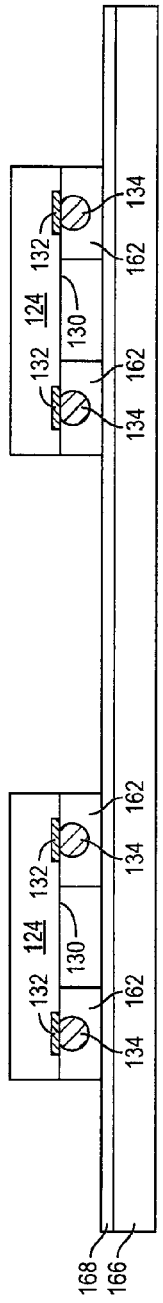

FIGS. 7a-7h illustrate, in relation to FIGS. 1 and 2a-2c, another process of forming a FO-WLCSP with ACF over the bumps of a semiconductor die. In FIG. 7a, a temporary carrier or substrate 166 contains sacrificial base material such as silicon, polymer, polymer composite, metal, ceramic, glass, glass epoxy, beryllium oxide, or other suitable low-cost, rigid material or bulk semiconductor material for structural support. An optional interface layer or double-sided tape 168 can be formed over carrier 166 as a temporary adhesive bonding film or etch-stop layer.

Semiconductor die 124 with ACF 162 formed over bumps 134 are mounted to carrier 166. FIG. 7b shows all semiconductor die 124 mounted to carrier 166 to form a reconstituted wafer with bumps 134 embedded within ACF 162.

Figure 7C:
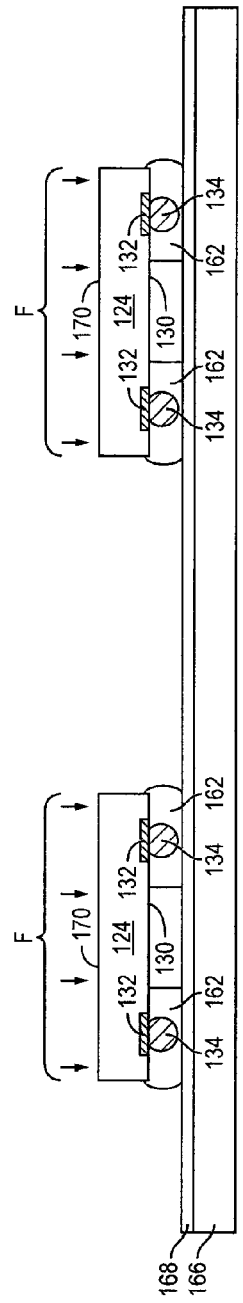

In FIG. 7c, a force F is applied to back surface 170 of semiconductor die 124, opposite active surface 130, under high temperature, e.g., 100-300° C. for 10 seconds to 60 minutes, to press the semiconductor die 124 against carrier 166 and compress a portion of ACF 162 under bumps 134. The force F compresses the matrix of conductive particles under bumps 134 to form a low resistance electrical connection to the bumps. An optional electric field can be applied in line with the contact pads or bumps to reposition the conductive particles inside ACF 162 to be aligned with or concentrated under the bumps or contact pads. The electric field aids in making physical connection between the conductive particles in the compressed ACF 162 in order to form an electrical path to bumps 134. The force F is removed after the portion of ACF 162 under bumps 134 is compressed. Bumps 134 remain substantially enclosed by ACF 162 after the force F is removed. The portion of ACF 162 under bumps 134 provides a low resistance electrical connection between the bumps and subsequent build-up interconnect structure. Bumps 134 can be relatively small, e.g., micro-bumps, to realize ultra thin packages without void formation. The small bumps 134 provide a fine interconnect pitch and, in some cases, can be omitted by compressing ACF 162 under contact pads 132. ACF 162 is cured by the elevated temperature to firmly hold semiconductor die 124 to carrier 166.

Figure 7D:
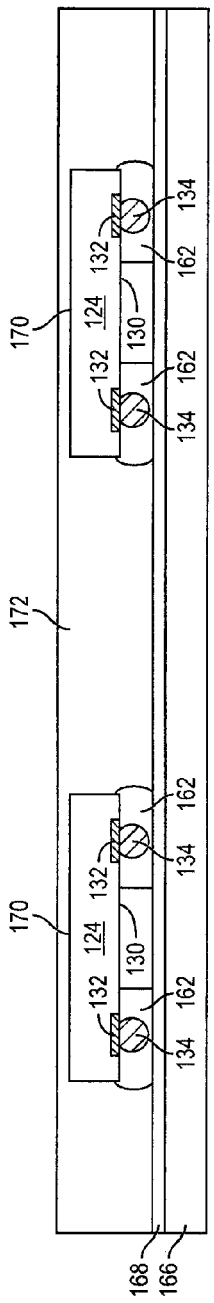

In FIG. 7d, an encapsulant or molding compound 172 is deposited over semiconductor die 124 and carrier 166 using a paste printing, compressive molding, transfer molding, liquid encapsulant molding, vacuum lamination, spin coating, or other suitable applicator. ACF 162 holds semiconductor die 124 to carrier 166 to reduce die shifting during encapsulation. Encapsulant 172 can be polymer composite material, such as epoxy resin with filler, epoxy acrylate with filler, or polymer with proper filler. Encapsulant 172 is non-conductive and environmentally protects the semiconductor device from external elements and contaminants.

FIG. 7e shows an optional backgrinding operation where grinder 174 removes a portion of encapsulant 172 and bulk material 122 from back surface 170 of semiconductor die 124. Semiconductor die 124 is thinner and new back surface 176 is co-planar with encapsulant 172 following the grinding process.

Continuing from FIG. 7d, temporary carrier 166 and interface layer 168 are removed by chemical etching, mechanical peel-off, CMP, mechanical grinding, thermal bake, UV light, laser scanning, or wet stripping, as shown in FIG. 7f.

In FIG. 7g, a bottom-side build-up interconnect structure 180 is formed over ACF 162, bumps 134, and encapsulant 172. The build-up interconnect structure 180 includes an electrically conductive layer or RDL 182 formed using a patterning and metal deposition process such as sputtering, electrolytic plating, and electroless plating. Conductive layer 182 can be one or more layers of Al, Cu, Sn, Ni, Au, Ag, or other suitable electrically conductive material. One portion of conductive layer 182 is electrically connected through the compressed portion of ACF 162 to bumps 134. Other portions of conductive layer 182 can be electrically common or electrically isolated depending on the design and function of the semiconductor device.

The build-up interconnect structure 180 further includes an insulating or passivation layer 184 formed between conductive layers 182 for electrical isolation. The insulating layer 184 extends to sensitive RF region 161 on active surface 130 between ACF 162. The insulating layer 184 contains one or more layers of SiO2, Si3N4, SiON, Ta2O5, Al2O3, or other material having similar insulating and structural properties. The insulating layer 184 is formed using PVD, CVD, printing, spin coating, spray coating, sintering or thermal oxidation.

In FIG. 7h, an electrically conductive bump material is deposited over build-up interconnect structure 180 and electrically connected to conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above its melting point to form spherical balls or bumps 186. In some applications, bumps 186 are reflowed a second time to improve electrical contact to conductive layer 182. The bumps can also be compression bonded to conductive layer 182. Bumps 186 represent one type of interconnect structure that can be formed over conductive layer 182. The interconnect structure can also use bond wires, stud bump, micro bump, or other electrical interconnect.

Semiconductor die 124 are singulated with saw blade or laser cutting tool 188 into individual FO-WLCSP 190. FIG. 8 shows FO-WLCSP 190 after singulation. Semiconductor die 124 is electrically connected through bumps 134 and the compressed portion of ACF 162 to build-up interconnect structure 180 and bumps 186. ACF 162 is omitted from sensitive RF region 161 on active surface 130. Compressing ACF 162 under bumps 134 forms a low resistance interconnect between contact pads 132 and conductive layer 182. ACF 162 eliminates the need to form wettable pads. ACF 162 bonds semiconductor die 124 to carrier 166 and reduces die shifting during encapsulation. Bumps 134 can be relatively small, e.g., micro-bumps, to realize ultra thin packages with a fine interconnect pitch and high I/O count.

In another embodiment, a temporary carrier or substrate 200 contains sacrificial base material such as silicon, polymer, polymer composite, metal, ceramic, glass, glass epoxy, beryllium oxide, or other suitable low-cost, rigid material or bulk semiconductor material for structural support. An optional interface layer or double-sided tape 202 can be formed over carrier 200 as a temporary adhesive bonding film or etch-stop layer.

Figure 9A:
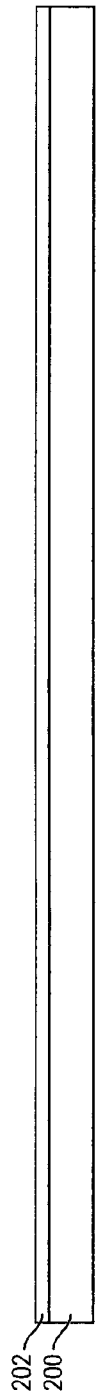
Figure 9B:
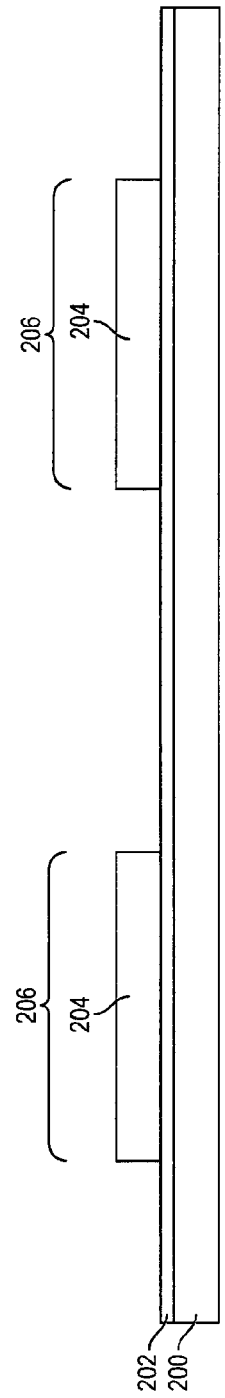

In FIG. 9b, ACF 204 is deposited over interface layer 202 by screen printing or other suitable application process. ACF 204 is disposed in an area 206 designed for mounting semiconductor die. Alternatively, ACP or ACA can be deposited over interface layer 202. ACF 204 can be epoxy or acryl-based material with B-stage properties for reliable wafer dicing. In one embodiment, ACF 204 contains a matrix of conductive particles, each having a polymer core with Ni plating and Au plating and outer polymer coating. ACF 204 has a thickness greater than a height of bumps 216. In its normal state, ACF 204 is non-conductive as the conductive particles are not in electrical contact with adjacent conductive particles. However, under proper conditions of force and temperature, certain portions of ACF 204 can be made conductive as the particles are forced together to form an electrical connection.

Figure 9C:
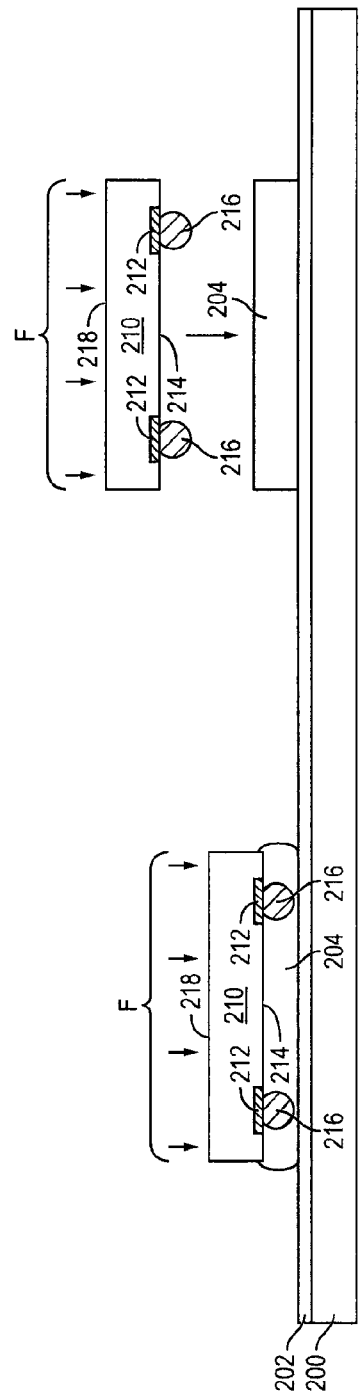

FIG. 9c shows semiconductor die 210 having contact pads 212 formed over active surface 214 oriented downward toward substrate 200. A plurality of bumps 216 is formed over contact pads 212. Active surface 214 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits, such as DSP, ASIC, memory, or other signal processing circuit. Semiconductor die 210 may also contain IPDs, such as inductors, capacitors, and resistors, for RF signal processing.

Figure 9D:
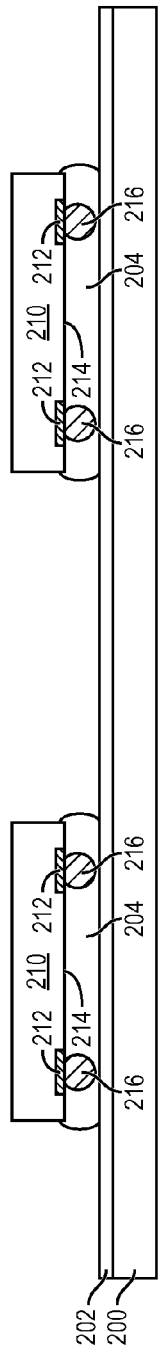

Semiconductor die 210 are placed over carrier 200 with active surface 214 aligned with ACF 204. Using a force F applied to back surface 218 of semiconductor die 210, opposite active surface 214, under high temperature, e.g., 100-300° C. for 10 seconds to 60 minutes, the semiconductor die bumps 216 are pressed into ACF 204 to embed the bumps within the ACF. The force F compresses the matrix of conductive particles under bumps 216 to form a low resistance electrical connection to the bumps. An optional electric field can be applied in line with the contact pads or bumps to reposition the conductive particles inside ACF 204 to be aligned with or concentrated under the bumps or contact pads. The electric field aids in making physical connection between the conductive particles in the compressed ACF 204 in order to form an electrical path to bumps 216. The portion of ACF 204 which is not under bumps 216, e.g., the portion of ACF 204 under active surface 214, remains in its normal state, i.e., non-compressed and non-conductive. As ACF 204 is compressed under force F, a portion of the ACF extends outwardly and over the edge of semiconductor die 210 which enhances adhesion between the semiconductor die and carrier. The force F is removed after active surface 214 contacts ACF 204 and the portion of ACF 204 under bumps 216 is compressed. Bumps 216 remain substantially enclosed by ACF 204 after the force F is removed. The portion of ACF 204 under bumps 216 provides a low resistance electrical connection between the bumps and subsequent build-up interconnect structure. Bumps 216 can be relatively small, e.g., micro-bumps, to realize ultra thin packages without void formation. The small bumps 216 provide a fine interconnect pitch and, in some cases, can be omitted by compressing ACF 204 under contact pads 212. FIG. 9d shows all semiconductor die 210 mounted to carrier 200 to form a reconstituted wafer with bumps 216 embedded within ACF 204. ACF 204 is cured by the elevated temperature to firmly hold semiconductor die 210 to carrier 200.

Figure 9E:
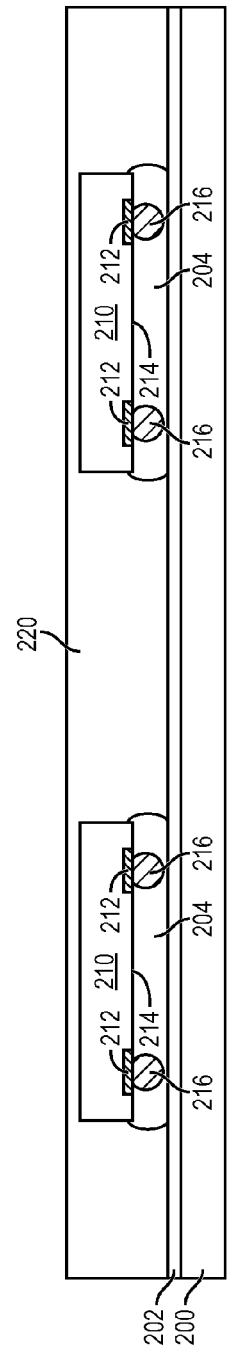

In FIG. 9e, an encapsulant or molding compound 220 is deposited over semiconductor die 210 and carrier 200 using a paste printing, compressive molding, transfer molding, liquid encapsulant molding, vacuum lamination, spin coating, or other suitable applicator. ACF 204 holds semiconductor die 210 to carrier 200 to reduce die shifting during encapsulation. Encapsulant 220 can be polymer composite material, such as epoxy resin with filler, epoxy acrylate with filler, or polymer with proper filler. Encapsulant 220 is non-conductive and environmentally protects the semiconductor device from external elements and contaminants.

Figure 9F:
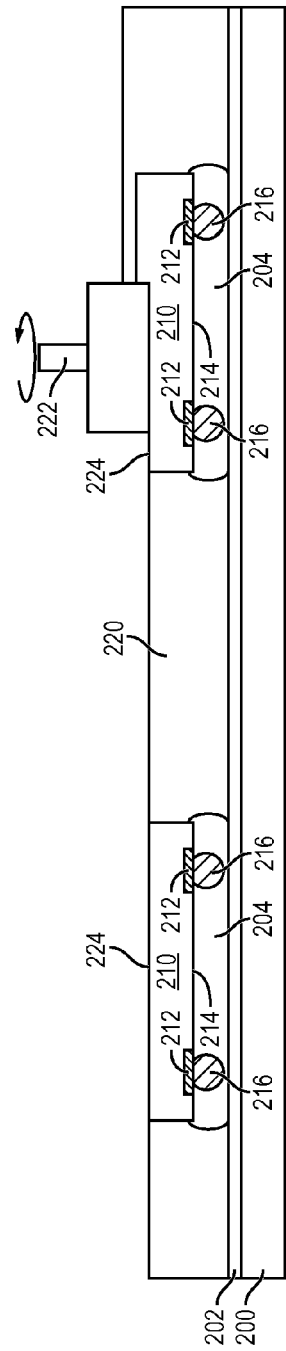

FIG. 9f shows an optional backgrinding operation where grinder 222 removes a portion of encapsulant 220 and bulk material from back surface 218 of semiconductor die 210. Semiconductor die 210 is thinner and new back surface 224 is co-planar with encapsulant 220 following the grinding process.

Continuing from FIG. 9e, temporary carrier 200 and interface layer 202 are removed by chemical etching, mechanical peel-off, CMP, mechanical grinding, thermal bake, UV light, laser scanning, or wet stripping, as shown in FIG. 9g.

In FIG. 9h, a bottom-side build-up interconnect structure 230 is formed over ACF 204, bumps 216, and encapsulant 220. The build-up interconnect structure 230 includes an electrically conductive layer or RDL 232 formed using a patterning and metal deposition process such as sputtering, electrolytic plating, and electroless plating. Conductive layer 232 can be one or more layers of Al, Cu, Sn, Ni, Au, Ag, or other suitable electrically conductive material. One portion of conductive layer 232 is electrically connected through the compressed portion of ACF 204 to bumps 216. Other portions of conductive layer 232 can be electrically common or electrically isolated depending on the design and function of the semiconductor device.

The build-up interconnect structure 230 further includes an insulating or passivation layer 234 formed between conductive layers 232 for electrical isolation. The insulating layer 234 contains one or more layers of $SiO_2$, $Si_3N_4$, SiON, $Ta_2O_5$, $Al_2O_3$, or other material having similar insulating and structural properties. The insulating layer 234 is formed using PVD, CVD, printing, spin coating, spray coating, sintering or thermal oxidation.

In FIG. 9i, an electrically conductive bump material is deposited over build-up interconnect structure 230 and electrically connected to conductive layer 232 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form spherical balls or bumps 236. In some applications, bumps 236 are reflowed a second time to improve electrical contact to conductive layer 232. The bumps can also be compression bonded to conductive layer 232. Bumps 236 represent one type of interconnect structure that can be formed over conductive layer 232. The interconnect structure can also use bond wires, stud bump, micro bump, or other electrical interconnect.

Semiconductor die 210 are singulated with saw blade or laser cutting tool 238 into individual FO-WLCSP 240, similar to FIG. 5. Semiconductor die 210 is electrically connected through bumps 216 and the compressed portion of ACF 204 to build-up interconnect structure 230 and bumps 236. Compressing ACF 204 under bumps 216 forms a low resistance interconnect between contact pads 212 and conductive layer 232. ACF 204 eliminates the need to form wettable pads. ACF 204 bonds semiconductor die 210 to carrier 200 and reduces die shifting during encapsulation. Bumps 216 can be relatively small, e.g., micro-bumps, to realize ultra thin packages with a fine interconnect pitch and high I/O count. In addition, ACF 204 acts as a buffer layer to reduce stress induced by CTE mismatch between semiconductor die 210 and build-up interconnect structure 230.

Figure 10:
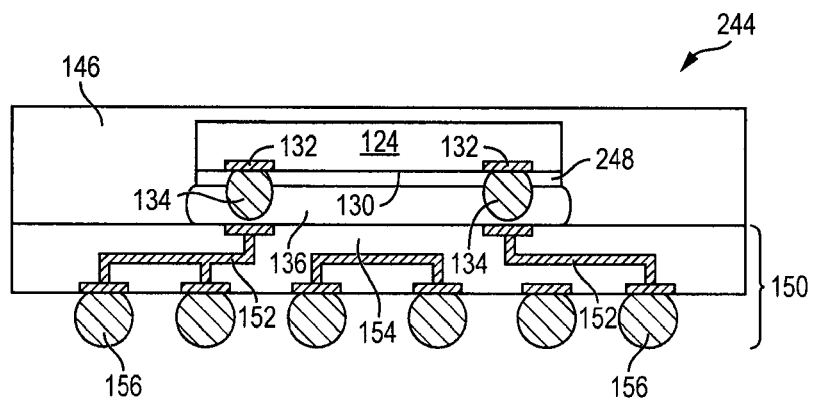
FIG. 10 illustrates an insulating layer formed between the ACF and active surface of the semiconductor die.

FIG. 10 shows an embodiment of FO-WLCSP 244, similar to FIG. 5, with insulating layer 248 formed between active surface 130 of semiconductor die 124 and ACF 136. The insulating layer 248 can be formed over active surface 130 in FIG. 3b, prior to forming ACF 136. Alternatively, insulating layer 248 can be formed over ACF 204 in FIG. 9b, prior to mounting semiconductor die 210.

Figure 11:
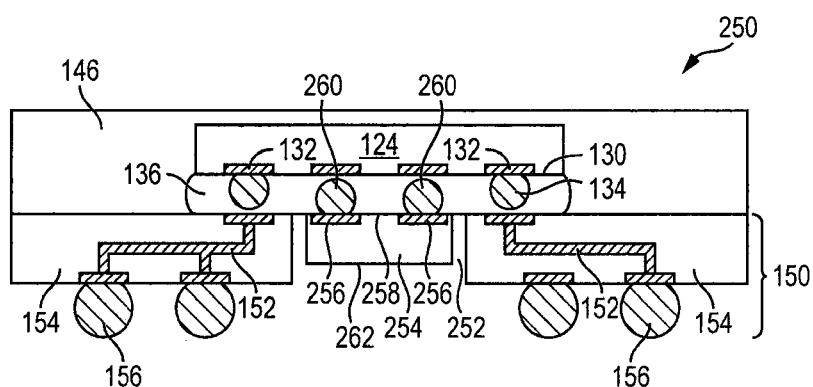
FIG. 11 illustrates a semiconductor component mounted in an opening of the interconnect structure to the upper semiconductor die.

FIG. 11 shows an embodiment of FO-WLCSP 250, similar to FIG. 5, with an opening 252 formed in interconnect structure 150. A semiconductor die or component 254 has contact pads 256 formed over active surface 258 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 258 to implement analog circuits or digital circuits, such as DSP, ASIC, memory, or other signal processing circuit. Semiconductor die 254 may also contain IPDs, such as inductors, capacitors, and resistors, for RF signal processing. In one embodiment, semiconductor die 254 is a flipchip type semiconductor die. A plurality of bumps 260 is formed over contact pads 256. A force is applied to back surface 262 of semiconductor die 254 under high temperature, e.g., 100-300° C. for 10 seconds to 60 minutes, to compress a portion of ACF 136 under bumps 260. The force compresses the matrix of conductive particles under bumps 260 to form a low resistance electrical connection between contact pads 132 and contact pads 256. Alternatively, a discrete passive or active device, such as a capacitor, inductor, resistor, diode, or power transistor, can be mounted in opening 252 and electrically connected to contact pads 132.

Figure 12:
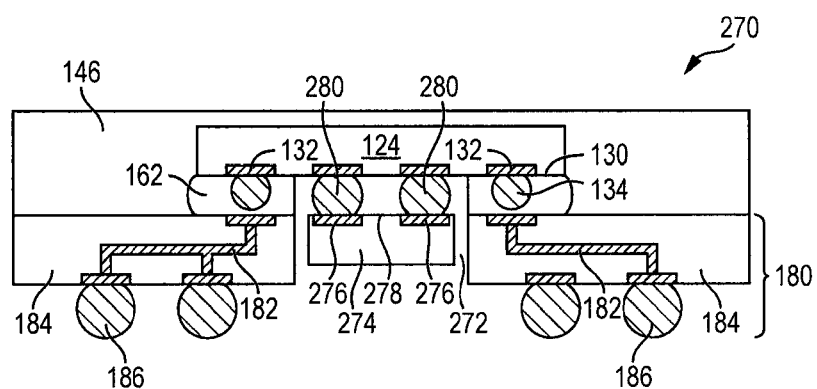
FIG. 12 illustrates another semiconductor component mounted in an opening of the interconnect structure to the upper semiconductor die.

FIG. 12 shows an embodiment of FO-WLCSP 270, similar to FIG. 8, with an opening 272 formed in interconnect structure 180. A semiconductor die or component 274 has contact pads 276 formed over active surface 278 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 278 to implement analog circuits or digital circuits, such as DSP, ASIC, memory, or other signal processing circuit. Semiconductor die 274 may also contain IPDs, such as inductors, capacitors, and resistors, for RF signal processing. In one embodiment, semiconductor die 274 is a flipchip type semiconductor die. Contact pads 276 of semiconductor die 274 are electrically connected to contact pads 132 with bumps 280. Alternatively, a discrete passive or active device, such as a capacitor, inductor, resistor, diode, or power transistor, can be mounted in opening 272 and electrically connected to contact pads 132.

Figure 13:
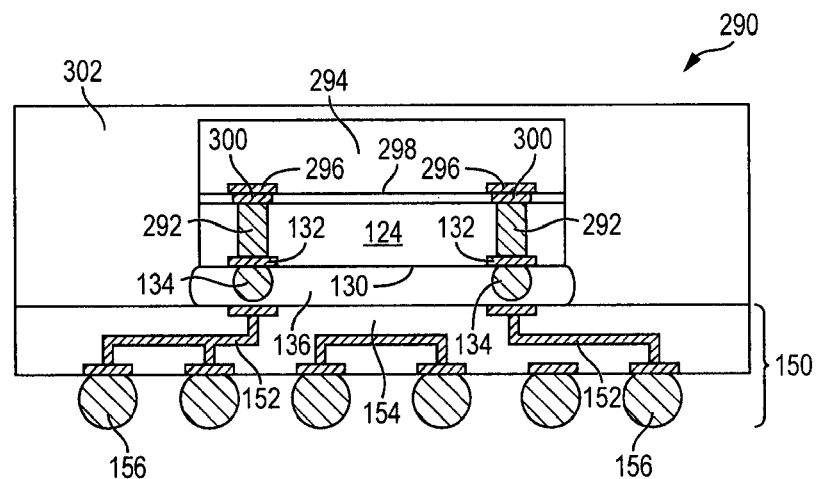
FIG. 13 illustrates a second semiconductor die or component mounted to the lower semiconductor die and electrically connected through conductive vias.

FIG. 13 shows an embodiment of FO-WLCSP 290, continuing from FIG. 4c, with a plurality of vias formed through semiconductor die 124 over contact pads 132 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form conductive pillars or vias 292 electrically connected to contact pads 132. Alternatively, a plurality of stud bumps or solder balls can be formed within the vias.

A semiconductor die or component 294 has contact pads 296 formed over active surface 298 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 298 to implement analog circuits or digital circuits, such as DSP, ASIC, memory, or other signal processing circuit. Semiconductor die 294 may also contain IPDs, such as inductors, capacitors, and resistors, for RF signal processing. In one embodiment, semiconductor die 294 is a flipchip type semiconductor die. Contact pads 296 of semiconductor die 294 are electrically connected to conductive pillars or vias 292 with bumps 300. Alternatively, a discrete passive or active device, such as a capacitor, inductor, resistor, diode, or power transistor, can be mounted to semiconductor die 124 and electrically connected to conductive pillars or vias 292.

An encapsulant or molding compound 302 is deposited over semiconductor die 124 and 294 using a paste printing, compressive molding, transfer molding, liquid encapsulant molding, vacuum lamination, spin coating, or other suitable applicator. Encapsulant 302 can be polymer composite material, such as epoxy resin with filler, epoxy acrylate with filler, or polymer with proper filler. Encapsulant 302 is non-conductive and environmentally protects the semiconductor device from external elements and contaminants.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of semiconductor die comprising bumps formed over contact pads on an active surface of the semiconductor die;
   depositing an anisotropic conductive film (ACF) over the bumps and active surface of the semiconductor wafer;
   singulating the semiconductor wafer to separate the semiconductor die;
   providing a temporary carrier;
   disposing the semiconductor die with the ACF oriented to the temporary carrier;
   compressing the ACF under the bumps to form a conductive portion of the ACF electrically connected to the bumps;
   curing the ACF to form a cured ACF;
   depositing an encapsulant over the semiconductor die and temporary carrier;
   removing the temporary carrier to expose the conductive portion of the cured ACF under the bumps; and
   forming an interconnect structure over the semiconductor die, cured ACF, and encapsulant with the interconnect structure being electrically connected through the conductive portion of the cured ACF to the bumps.

2. The method of claim 1, further including planarizing a back surface of the semiconductor die, opposite the active surface.

3. The method of claim 1, wherein the ACF reduces shifting of the semiconductor die during encapsulation.

4. The method of claim 1, further including forming an insulating layer between the ACF and active surface of the semiconductor die.

5. The method of claim 1, further including:
   forming an opening in the interconnect structure;
   disposing a semiconductor component within the opening; and
   electrically connecting the semiconductor component to the semiconductor die.

6. The method of claim 1, further including:
   forming a plurality of conductive vias through the semiconductor die;
   disposing a semiconductor component over a back surface of the semiconductor die opposite the active surface; and
   electrically connecting the semiconductor component to the semiconductor die through the conductive vias.

7. A method of making a semiconductor device, comprising:
   providing a semiconductor die including bumps formed over contact pads on an active surface of the semiconductor die;
   depositing an anisotropic conductive film (ACF) over the bumps;
   providing a carrier;
   disposing the semiconductor die with the ACF oriented to the carrier;
   compressing the ACF under the bumps to form a conductive portion of the ACF;
   depositing an encapsulant over the semiconductor die and carrier;
   removing the carrier to expose the conductive portion of the ACF; and
   forming an interconnect structure on the encapsulant and conductive portion of the ACF with the interconnect structure being electrically connected through the conductive portion of the ACF to the bumps.

8. The method of claim 7, further including planarizing a back surface of the semiconductor die, opposite the active surface.

9. The method of claim 7, wherein the ACF reduces shifting of the semiconductor die during encapsulation.

10. The method of claim 7, further including forming an insulating layer between the ACF and active surface of the semiconductor die.

11. The method of claim 7, further including:
forming an opening in the interconnect structure;
disposing a semiconductor component within the opening; and
electrically connecting the semiconductor component to the semiconductor die.

12. The method of claim 7, further including:
forming a plurality of conductive vias through the semiconductor die;
disposing a semiconductor component over a back surface of the semiconductor die opposite the active surface; and
electrically connecting the semiconductor component to the semiconductor die through the conductive vias.

13. A method of making a semiconductor device, comprising:
providing a semiconductor die including contact pads;
disposing the semiconductor die over an anisotropic conductive film (ACF);
compressing the ACF under the contact pads to form a compressed ACF;
curing the ACF to form a cured ACF;
depositing an encapsulant over the semiconductor die to leave the cured ACF under the contact pads exposed; and
forming an interconnect structure over the semiconductor die and encapsulant with the interconnect structure being electrically connected through the compressed ACF to the contact pads of the semiconductor die.

14. The method of claim 13, wherein forming the compressed ACF further includes:
forming a plurality of bumps over the contact pads;
disposing the semiconductor die over a carrier; and
forcing the semiconductor die against the carrier to compress the ACF under the bumps to form the compressed ACF.

15. The method of claim 13, further including planarizing a back surface of the semiconductor die.

16. The method of claim 13, wherein the ACF reduces shifting of the semiconductor die during encapsulation.

17. The method of claim 13, further including forming an insulating layer between the ACF and semiconductor die.

18. The method of claim 13, further including:
forming an opening in the interconnect structure;
disposing a semiconductor component within the opening; and
electrically connecting the semiconductor component to the semiconductor die.

19. The method of claim 13, further including:
forming a plurality of conductive vias through the semiconductor die;
disposing a semiconductor component over a back surface of the semiconductor die; and
electrically connecting the semiconductor component to the semiconductor die through the conductive vias.

20. A method of making a semiconductor device, comprising:
providing a semiconductor die;
disposing the semiconductor die over an anisotropic conductive film (ACF);
compressing the ACF beneath the semiconductor die to leave a conductive portion of the ACF opposite the semiconductor die exposed; and
forming a conductive layer over the conductive portion of the ACF.

21. The method of claim 20, further including planarizing a back surface of the semiconductor die.

22. The method of claim 20, wherein the ACF reduces shifting of the semiconductor die during encapsulation.

23. The method of claim 20, further including forming an interconnect structure over the conductive portion of the ACF.

24. The method of claim 23, further including:
forming an opening in the interconnect structure;
disposing a semiconductor component within the opening; and
electrically connecting the semiconductor component to the semiconductor die.

* * * * *